US010848238B1

(12) United States Patent
Iyer et al.

(10) Patent No.: US 10,848,238 B1
(45) Date of Patent: Nov. 24, 2020

(54) EVOLVED PACKET SYSTEM OVER NON-LTE RADIO ACCESS NETWORK

(71) Applicant: LOCKHEED MARTIN CORPORATION, Bethesda, MD (US)

(72) Inventors: Suresh K. Iyer, Germantown, MD (US); Dilip S. Gokhale, Germantown, MD (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 15/846,096

(22) Filed: Dec. 18, 2017

Related U.S. Application Data (60) Provisional application No. 62/458,539, filed on Feb. 13, 2017.

(51) Int. Cl.
  *H04B 7/185* (2006.01)

(52) U.S. Cl.
  CPC ..... *H04B 7/18595* (2013.01); *H04B 7/18532* (2013.01); *H04B 7/18543* (2013.01); *H04B 7/18563* (2013.01); *H04B 7/18526* (2013.01)

(58) Field of Classification Search
  CPC ............ H04B 7/18526; H04B 7/18595; H04B 7/18532; H04B 7/18543; H04B 7/18563; H04W 8/26; H04W 76/12; H04W 88/16
  See application file for complete search history.

(56) References Cited

U.S. PATENT DOCUMENTS

| | | | |
|---|---|---|---|
| 6,570,859 B1 | 5/2003 | Cable | |
| 8,886,780 B2 * | 11/2014 | Kamdar | H04L 47/20 709/223 |
| 9,402,176 B2 * | 7/2016 | Wang | H04W 8/02 |
| 9,485,667 B2 * | 11/2016 | Kamdar | H04W 16/18 |
| 9,775,129 B2 * | 9/2017 | Kamdar | H04W 16/18 |
| 9,930,613 B2 * | 3/2018 | Starsinic | H04W 4/70 |
| 10,172,032 B2 * | 1/2019 | Roy | H04W 76/10 |
| 10,177,837 B2 * | 1/2019 | Ravishankar | H04B 7/18513 |
| 2002/0041328 A1 | 4/2002 | LeCompte | |

(Continued)

FOREIGN PATENT DOCUMENTS

| | | | |
|---|---|---|---|
| EP | 2793530 A1 * | 10/2014 | ............ H04W 12/06 |
| EP | 2793530 A4 * | 10/2015 | ............ H04W 12/06 |

(Continued)

OTHER PUBLICATIONS

3GPP, Non-Access Startum (NAS) Protocol for Evolved Packet Systems (EPS); Stage 3 (Release 14), Dec. 2016, 3GPP, Version 14.2.0 (Year: 2016).*

*Primary Examiner* — Eric Nowlin (74) *Attorney, Agent, or Firm* — Morgan, Lewis & Bockius LLP (57) ABSTRACT

A communication device includes a session and mobility management block configured to interface with a mobility management entity (MME) of an evolved packet core (EPC) of an evolved packet system (EPS). An access non-LTE air interface circuit is configured to communicate with an access network gateway. An EPS inter-working functional block including mapping and coordination logic is configured to map and coordinate a plurality of functionalities associated with the access non-LTE air interface circuit into corresponding functionalities associated with the session and mobility management block.

18 Claims, 6 Drawing Sheets

(56) References Cited

U.S. PATENT DOCUMENTS

| | | | |
|---|---|---|---|
| 2004/0185775 A1 | 9/2004 | Bell | |
| 2008/0159419 A1 | 7/2008 | Smith | |
| 2009/0279515 A1* | 11/2009 | Cheon | H04W 36/0033 370/338 |
| 2010/0068993 A1 | 3/2010 | Khan | |
| 2010/0280907 A1 | 11/2010 | Wolinsky et al. | |
| 2012/0034912 A1* | 2/2012 | Kamdar | H04L 47/20 455/425 |
| 2012/0040664 A1* | 2/2012 | Kamdar | H04W 16/18 455/425 |
| 2012/0058791 A1 | 3/2012 | Bhattad | |
| 2012/0063302 A1 | 3/2012 | Damnjanovic | |
| 2012/0154055 A1 | 6/2012 | Yamamoto | |
| 2013/0195002 A1 | 8/2013 | Walker | |
| 2013/0336256 A1 | 12/2013 | Chung | |
| 2014/0156844 A1* | 6/2014 | Cavgalar | H04L 65/1073 709/225 |
| 2014/0226502 A1 | 8/2014 | Behnamfar | |
| 2014/0293937 A1 | 10/2014 | Lee | |
| 2015/0071169 A1* | 3/2015 | Wang | H04W 8/02 370/328 |
| 2015/0124616 A1* | 5/2015 | Lohman | H04L 43/0894 370/235 |
| 2015/0319567 A1 | 11/2015 | Edge | |
| 2015/0327328 A1 | 11/2015 | Novak et al. | |
| 2016/0006500 A1* | 1/2016 | Radpour | H04B 7/18539 370/319 |
| 2016/0014586 A1* | 1/2016 | Stupar | H04W 16/32 455/404.2 |
| 2016/0072574 A1* | 3/2016 | Xu | H04B 7/18586 370/230 |
| 2016/0192277 A1* | 6/2016 | Starsinic | H04W 4/70 370/329 |
| 2016/0219569 A1 | 7/2016 | Kuo | |
| 2016/0241325 A1 | 8/2016 | Raghothaman | |
| 2016/0366687 A1 | 12/2016 | Guo | |
| 2017/0019882 A1 | 1/2017 | Nimbalker et al. | |
| 2017/0019914 A1 | 1/2017 | Rune | |
| 2017/0026931 A1* | 1/2017 | Kamdar | H04W 16/18 |
| 2017/0041830 A1 | 2/2017 | Davis | |
| 2017/0094512 A1* | 3/2017 | Kiss | H04L 63/0853 |
| 2017/0195930 A1* | 7/2017 | Tomici | H04W 8/06 |
| 2017/0332416 A1* | 11/2017 | Kiss | H04L 61/304 |
| 2017/0366251 A1* | 12/2017 | Ravishankar | H04B 7/18513 |
| 2018/0013486 A1* | 1/2018 | Irani | H04B 7/18521 |
| 2018/0092157 A1 | 3/2018 | Chen | |
| 2018/0146445 A1 | 5/2018 | Lee | |
| 2018/0205639 A1* | 7/2018 | Zakaria | H04L 45/04 |
| 2018/0212710 A1* | 7/2018 | Ronneke | H04W 28/02 |
| 2018/0213434 A1* | 7/2018 | Roy | H04W 76/10 |
| 2018/0227752 A1* | 8/2018 | Teyeb | H04W 12/04 |
| 2018/0242218 A1* | 8/2018 | Muscariello | H04W 40/02 |
| 2018/0270703 A1 | 9/2018 | Kodali | |
| 2018/0295651 A1 | 10/2018 | Cao | |
| 2018/0316414 A9* | 11/2018 | Ravishankar | H04B 7/18513 |
| 2018/0324634 A1* | 11/2018 | Harrington | H04W 28/0273 |
| 2018/0352547 A1 | 12/2018 | Tabet | |
| 2018/0376384 A1* | 12/2018 | Youn | H04W 36/0022 |
| 2019/0052603 A1* | 2/2019 | Wu | H04W 12/06 |
| 2019/0124561 A1* | 4/2019 | Faccin | H04W 76/16 |
| 2019/0230508 A1* | 7/2019 | Olsson | H04W 8/30 |
| 2020/0007226 A1* | 1/2020 | Takagi | H04B 7/18539 |

FOREIGN PATENT DOCUMENTS

| | | | |
|---|---|---|---|
| KR | 2013-0125280 | 11/2013 | |
| KR | 2013-0125281 | 11/2013 | |
| KR | 2016-0053562 | 5/2016 | |
| WO | WO-2013086917 A1 * | 6/2013 | H04W 12/06 |
| WO | WO 2013/168872 | 11/2013 | |
| WO | WO 2013/168880 | 11/2013 | |
| WO | WO-2017045123 A1 * | 3/2017 | H04W 12/06 |

* cited by examiner

EVOLVED PACKET SYSTEM OVER NON-LTE RADIO ACCESS NETWORK

CROSS-REFERENCE TO RELATED APPLICATIONS

This application claims the benefit of priority under 35 U.S.C. § 119 from U.S. Provisional Patent Application 62/458,539 filed Feb. 13, 2017, which is incorporated herein by reference in its entirety.

STATEMENT REGARDING FEDERALLY SPONSORED RESEARCH OR DEVELOPMENT

Not applicable

FIELD OF THE INVENTION

The present invention generally relates to satellite communications, and more particularly, to long-term evolution (LTE)-enabled satellite networks.

BACKGROUND

There is significant interest in using the 4G long term evolution (LTE) physical layer over satellite links. Mobile satellite networks are increasingly assessing the use of LTE as the air interface (radio access technology) for next generation systems. Using the widely deployed, field proven LTE physical layer in conjunction with associated Layer 2 and 3 radio access technologies can be very beneficial for satellite networks. LTE technology provides several benefits, for example, seamless support for 4G and/or evolved packet system (EPS)-based services, a range of standardized modulation and coding schemes and standardized resource definitions (e.g., frequency and time) that are well suited for 4G and/or EPS services. LTE technology further supports dynamic control of modulation/coding depending upon link and terminal characteristics, supports dynamic resource allocation depending upon user traffic needs and is compatible with the evolved packet core (EPC) network via the S1 interface. There are, however, a number of areas where LTE default protocols and/or procedures need to be modified for use in a satellite environment.

EPS services introduced in 3GPP Release 8 represents a fundamental paradigm shift in mobile terrestrial wireless networks. Introduced as part of the system architecture evolution (SAE), EPS supports real time user services, such as voice, as well as data services over an internet protocol (IP) based framework. To ensure that user services and associated traffic are appropriately handled, EPS defines a comprehensive quality of service (QoS) model for the processing of user traffic.

SUMMARY

According to various aspects of the subject technology, methods and configuration for utilizing long term evolution (LTE)-enabled satellite networks are provided. In some aspects, the subject technology supports interworking functions for seamless interoperability and operation of non-LTE access network with the evolved packet core (EPC) networks.

In one or more aspects, a communication device includes a session and mobility management block configured to interface with a mobility management entity (MME) of an evolved packet core (EPC) of an evolved packet system (EPS). An access air interface circuit is configured to communicate with an access network gateway. An EPS inter-working functional block including mapping and coordination logic is configured to map and coordinate a plurality of functionalities associated with the access air interface circuit into corresponding functionalities associated with the session and mobility management block.

In one or more aspects, an access network gateway apparatus includes an access air interface circuit configured to communicate with a user equipment. An access adaptation block is configured to map a plurality of functionalities associated with the access air interface circuit into corresponding functionalities associated with an evolved packet system (EPS). A control block is configured to interface the access adaptation block with a mobility management entity (MME) of an evolved packet core (EPC) of the EPS. A gateway block is configured to interface the access adaptation block with a signaling gateway (SGW) and a packet data network gateway (PGW).

In one or more aspects, a method includes configuring a session and mobility management block to interface with a mobility management entity (MME) of an evolved packet core (EPC) of an evolved packet system (EPS). The method further includes configuring an access air interface circuit to communicate with an access network gateway. An EPS inter-working functional block including mapping and coordination logic is provided. The EPS inter-working functional block is configured to map and coordinate a plurality of functionalities associated with the access air interface circuit into corresponding functionalities associated with the session and mobility management block.

The foregoing has outlined rather broadly the features of the present disclosure in order that the detailed description that follows can be better understood. Additional features and advantages of the disclosure will be described hereinafter, which form the subject of the claims.

BRIEF DESCRIPTION OF THE DRAWINGS

For a more complete understanding of the present disclosure, and the advantages thereof, reference is now made to the following descriptions to be taken in conjunction with the accompanying drawings describing specific aspects of the disclosure, wherein.

DETAILED DESCRIPTION

The detailed description set forth below is intended as a description of various configurations of the subject technology and is not intended to represent the only configurations in which the subject technology can be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and can be practiced using one or more implementations. In one or more instances, well-known structures and components are shown in block diagram form in order to avoid obscuring the concepts of the subject technology.

The present disclosure is directed, in part, to systems and configurations for utilizing long term evolution (LTE)-enabled satellite networks. In some aspects, the subject technology provides interworking functions for seamless interoperability and operation of non-LTE access network with the evolved packet core (EPC) networks. In one or more aspects, the subject technology provides solutions for both uplink and downlink resource allocation procedures, reduces overhead and improves system capacity utilization to addresses ineffectiveness of the LTE standard procedures in a satellite environment.

Figure 1A:
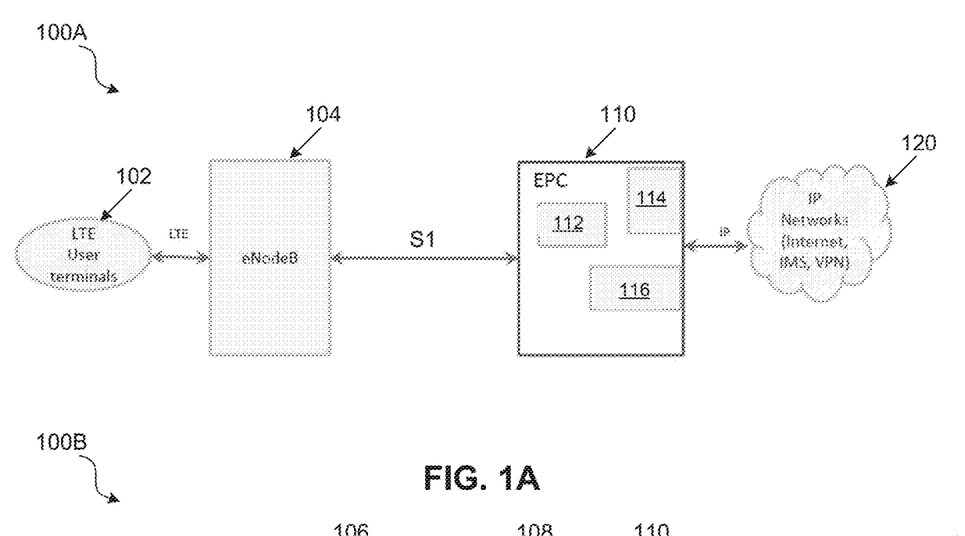
FIGS. 1A and 1B are high-level diagrams illustrating example architectures of systems for deployment of evolved packet system (EPS) services over a long term evolution (LTE) radio network and a non-LTE radio network, according to certain aspects of the disclosure.
Figure 1B:
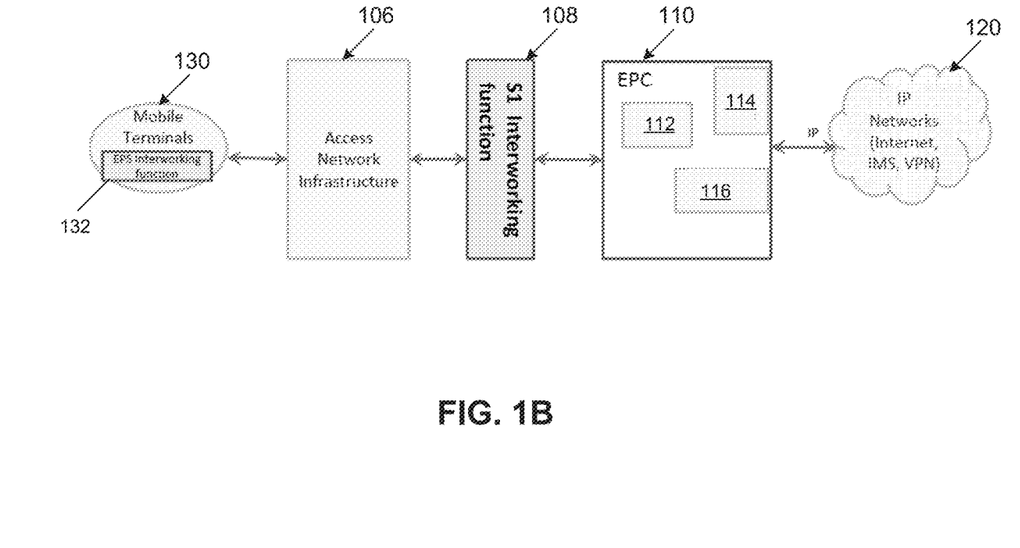

FIGS. 1A and 1B are high-level diagrams illustrating example architectures of systems 100A and 100B for deployment of evolved packet system (EPS) services over a long term evolution (LTE) radio network and a non-LTE radio network, according to certain aspects of the disclosure. The system 100A includes one or more LTE user terminal 102, an LTE base station 104, an evolved packet core (EPC) block 110 and a network 120. The LTE user terminal 102 can be an LTE-enabled user equipment (UE) device such as a mobile phone, a tablet, a laptop, a personal digital assistants (PDA), or other LTE enabled mobile communication devices. The LTE user terminal 102 can also be referred to as a station (STA) or a terminal. In some embodiments, the LTE base station 104 can be an evolved Node B (eNodeB) or eNB that has minimum functionalities and is controlled by a radio network controller (RNC). The eNB sends and receives radio transmissions to all the mobile devices (e.g., LTE user terminal 102) using the analogue and digital signal processing functions of the LTE air interface. The eNB 104 further controls the low-level operation of all its mobile devices, by sending them signaling messages such as handover commands.

The EPC block 110 can connect to the eNB 104 using an S1 interface and also communicates over the network 120. The EPC block 110 includes mobility management entity (MME) 112, a home subscriber server (HSS) and policy control and charging rules function (PCRF) module 114 and a serving gateway (SWG) and packet data network (PDN) gateway (PWG) 116. The MME 112 is a main signaling node in the EPC block 110 and can be responsible for initiating paging and authentication of the LTE user terminal 102. The HSS is a central database that contains information about all the network operator's subscribers. The PCRF is responsible for policy control decision-making, as well as for controlling the flow-based charging functionalities in the policy control enforcement function (PCEF), which resides in the PGW. The SGW may act as a router, and can forward data between the eNB 104 and the PDN gateway, and PGW is responsible for communicating with outside world via the network 120. The network 120 may be an IP network, for example, the Internet, an IP multimedia subsystem (IMS) network, a virtual private network (VPN), or the like.

EPS service introduced in 3GPP Release 8, as part of the system architecture evolution (SAE), supports real time user services (such as voice) as well as data services over an Internet Protocol (IP) based framework. To ensure that user services and associated traffic are appropriately handled, EPS defines a comprehensive quality of service (QoS) model for the processing of user traffic. User traffic is classified into bearers that are associated with a specific class and corresponding QoS parameters for traffic handling. These QoS parameters include guaranteed bit rate (GBR) or non-guaranteed bit rate (non-GBR) processing, priority handling, packet delay budget and packet error loss rate. EPS services are deployed over EPC, which defines core network nodes such as the PGW, MME and PCRF, and protocols such as Non-Access Stratum (NAS) between the UE (e.g., 102) and the MME 112.

3GPP Release 8 also standardized LTE specifications that define the air-interface (e.g., physical layer and link layer) within the radio access network (RAN) to provide the underlying capabilities in support of EPS services. The approach of using EPS services and underlying EPC infrastructure coupled with the LTE RAN is being widely deployed on a global basis. There are, however, technical limitations in using LTE as the air interface on a ubiquitous basis. For instance, the LTE air interface may not be appropriate in most satellite networks given constraints such as limited frequency spectrum. Thus, while there is a strong desire by service providers to utilize the EPS services paradigm, deploying them over non-LTE radio networks has significant impediments. This subject technology proposes specific techniques that address these impediments and enable EPS services to be deployed over non-LTE access networks, as discussed below.

The system 100B shown in FIG. 1B uses the techniques of the subject technology to address the above mentioned impediments and to enable deployment of EPS services over a non-LTE access network (e.g., a satellite network) including a mobile terminal 130 and an access network resource (infrastructure) 106. For example, the system 100B introduces an EPS interworking function 132 in the mobile terminal (e.g., a UE) 130 and an S1 internetworking function 108 between the access network resource 106 and the EPC block 110. A typical non-LTE access network does not support functionality compatible with EPS and/or EPC semantics for session management (including authentication and identity management), mobility management, bearer management and QoS processing.

The disclosed solution employs the EPS interworking function 132 and the S1 internetworking function 108 for seamless interoperability and operation of non-LTE access network with the EPC. The EPS interworking function 132 at the UE 130 takes care of session management, mobility management and QoS processing. The S1 interworking function 108 at the non-LTE radio access network (RAN) adapts the access network capabilities and/or messages and ensures that the access network appears to the EPC as an LTE access network by implementing the S1 interface defined within 3GPP. The S1 interworking function 108 further identifies specific capabilities to be supported by the non-LTE access network to facilitate the interworking. To facilitate the deployment over existing non-LTE networks, a number of additional capabilities have been introduced.

There are a number of challenges to be addressed and the subject disclosure presents solutions as discussed herein. Referring to FIG. 1A, an EPS session setup is triggered at the eNB 104 and the S1 initial UE message containing a NAS protocol data unit (PDU) attach request is sent to the MME 112 based on the user request for PDN access in standard 4G LTE network. The non-LTE network, however, has to use a different method for initial access. The EPS Interworking function 132 at the UE 130 forwards the NAS PDU attach request after the access network radio resource 106 connections has been established. In some aspects, the forwarding could also be the trigger to the establishment of the access network radio resource 106 connection.

Upon receipt of this PDU, the S1 interworking function 108 triggers session establishment in the EPS domain by generating the S1 initial UE message. The S1 interworking function 108 generates EPS user context information (e.g., tracking area) by mapping corresponding info from the access network domain and inserting it in the S1 initial UE message. In the next step, EPS uses globally unique temporary UE identity (GUTI) as the temporary identifier for a registered user. Because the access network uses different identifiers for users, the S1 interworking function 130 has to handle these disparate identifiers for realizing an end-to-end session establishment and data transfer. The S1 interworking function 108 maintains a mapping of the EPS identifiers to access network temporary IDs. Access network gateway can provide and/or use the temporary identifiers in the access network and the MME 112 provides and/or uses the EPS session identifiers.

In a next step, the EPS authentication and registration provides the location of the user in terms of a tracking area to the core network. Since the access network uses its own approach for location and/or cell identification, the S1 interworking function 108 has to enable satisfaction of the EPS requirements for tracking area identification. In some implementations, the S1 interworking function 108 maintains a mapping of the EPS tracking area identifiers to the access network location identifiers. In one or more implementations, the access network gateway provides the user location in the access domain and the S1 interworking function 108 maps it to the tracking area in the EPS domain.

The EPS session setup is based on NAS message exchanges between the UE and the MME 112 with a transparent transfer of NAS messages across the underlying radio network. The UE 130 has to handle the NAS messages and the access network ground gateway has to enable this transfer. In some implementations, the disclosed solution for NAS handling is based on tagging and inserting and/or removing EPS NAS layer messaging over the user plane within the access network. The S1 interworking function 108 may forward such a received message as an uplink NAS message to the MME. Similarly any downlink NAS message received from the MME 112 is forwarded via this mechanism by the S1 interworking function 108.

The EPS session setup procedures have failure responses for unsuccessful attempts and other error conditions. These error conditions are to be conveyed to the access network infrastructure. In some implementations, the S1 interworking function 108 maps the S1AP cause codes received from the MME 112 to the access specific error and/or failure codes. The S1AP cause codes for radio network layer cause, transport layer cause, NAS cause and protocol cause are translated into the corresponding access network error and/or failure codes via a configurable mapping table.

Similarly the failures on the access network resource 106 have to be conveyed to the EPS infrastructure. In one or more implementations, the S1 interworking function 108 maps the access network specific error and/or failure codes to S1AP cause codes. In some implementations, the Access network error and/or failure codes are translated into the corresponding S1AP cause codes for radio network layer cause, transport layer cause, NAS cause and protocol cause via a configurable mapping table. Further, with respect to bearer management, EPS bearer setup procedure creates a corresponding radio bearer on the radio interface with defined treatment of packets. This setup procedure has to be handled with the access network with fewer radio bearers or less capable bearers. In one or more implementations, the interworking function 108 and the EPS Interworking function 132 implement customized traffic management (TM) that adapt EPS bearer semantics to the capabilities within the access network. The TM functions include classification, policing, shaping, queuing, scheduling, and active queue management. The TM parameters are established when EPS bearers are established with an E-UTRAN radio access Bearer (E-RAB) setup request message from the MME 112.

The EPS-bearer-modify procedure updates the parameters associated with the radio bearer on the radio interface. This modify procedure is to be handled in an access network with fewer bearers, less capable bearers or a single bearer. In some implementations, the S1 interworking function 108 and the EPS Interworking function 132 implement customized traffic management (TM) that adapt EPS bearer semantics to the capabilities within the access network. The TM functions include classification, policing, shaping, queuing, scheduling and active queue management. The TM parameters are established when EPS bearers are modified with the E-RAB modify request from the MME 112.

The access network may not be able to support all the QoS capabilities identified within EPS. In some implementations, S1 interworking function 108 implements a customized call admission control function to reject the requests that cannot be supported based on the capabilities of the access network. This admission control function can be executed when the E-RAB setup request or E-RAB modify request messages are received from the MME 1122 to setup or modify a bearer.

In EPS service, the user has to re-register only when the user moves outside of tracking area list of cells. MME 112 pages user in the known tracking areas. This paging has to work with an access network with no equivalent tracking area lists. In one or more implementations, the S1 interworking function 108 implements a mapping function for modifying the paging request received from MME 112 to match the access network location parameters and sends it to the access network gateway to page the user. The mapping function can translate the tracking area provided by the MME 112 to the beam and/or cell coordinates provided by the access network during UE registration.

The EPS service supports emergency calls, which can be setup to a public safety and crime prevention committee (PSCP) with or without a UMTS subscriber identify module (USIM) at the UE 130. The support is with an LTE network session setup that sets up a radio resource control (RRC) connection with session setup reason as emergency. Even when the access network supports its own mechanism of emergency call indication, the EPS infrastructure has to be notified of the call type. In some implementations, the S1 interworking function implements an emergency session notification interface from the access network gateway as part of the radio session establishment and saves this context. The emergency session indicator may be appended to the S1 initial UE message sent to the MME 112 for setting up an emergency call.

Figure 2A:
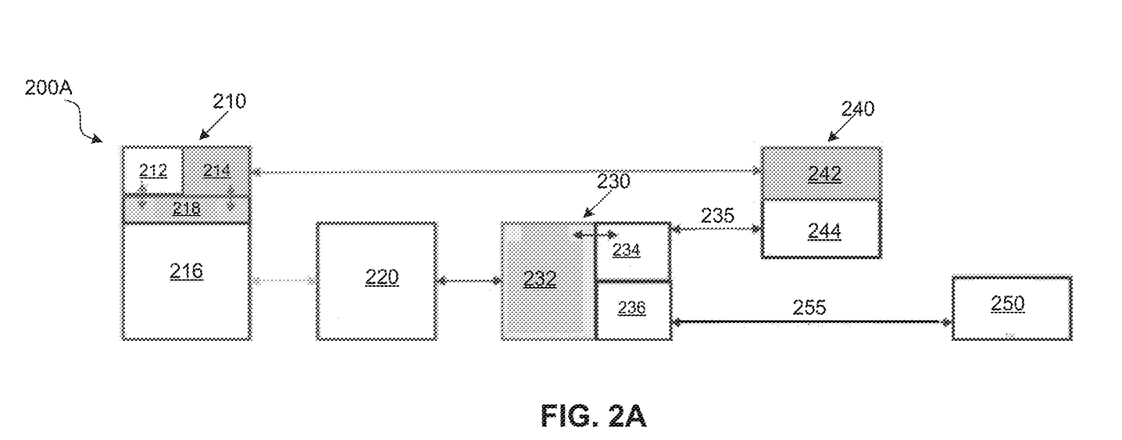
FIGS. 2A, 2B and 2C are block diagrams illustrating an example system for deployment of EPS services over a non-LTE radio network and corresponding functional block diagrams, according to certain aspects of the disclosure.
Figure 2B:
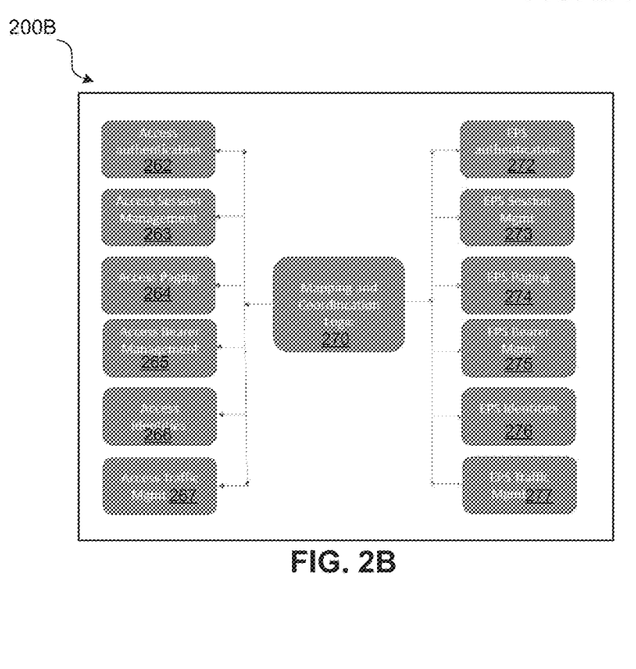
Figure 2C:
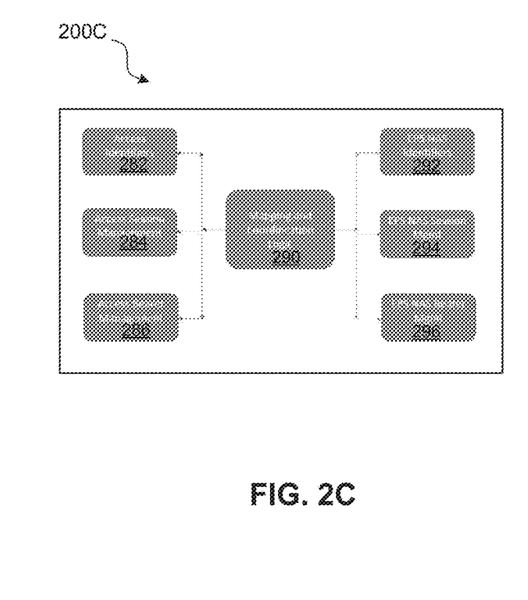

FIGS. 2A, 2B and 2C are block diagrams illustrating an example of a system 200A for deployment of EPS services over a non-LTE radio network and corresponding functional block diagrams 200B and 200C, according to certain aspects of the disclosure. The system 200A is similar to the system 100B of FIG. 1B, except for more structural details of various blocks and modules that are discussed herein. The system 200A includes the UE 210, an access air interface block 220, a S1 interworking function block 230, an MME block 240 and a SGW and/or PGW (SGW/PGW) block 250. The UE 210 is similar to the UE 130 of FIG. 1B and shows the structures that enable EPS functionalities such as a data plane block 212, a NAS block 214 and an EPS interworking function block 218 in addition to an access air interface 216. The data plane block 212 is responsible for carrying user traffic. The NAS block 214 is responsible for EPS session setup using NAS message exchanges between the UE 210 and the MME block 240 with a transparent transfer of NAS messages across the underlying radio network. In some implementations, the disclosed solution for NAS handling is based on tagging and inserting and/or removing EPS NAS layer messaging over the user plane within the access network. The S1 interworking function block 218 may forward such a received message as an uplink NAS message to the MME. Similarly any downlink NAS message received from the MME block 240 is forwarded via this mechanism by the S1 interworking function block 230.

In some embodiments, the EPS interworking function block 218 is responsible for session and/or mobility management and traffic and or bearer management. For example, EPS interworking function block 218 may implement customized traffic management (TM) that adapt EPS bearer semantics to the capabilities within the access network. The TM parameters can be established when EPS bearers are modified with the E-RAB modify request from the MME block 240. The TM functions may include classification, policing, shaping, queuing, scheduling and active queue management. The access air interface block 220 is similar to the access network infrastructure 106 of FIG. 1B and functions as an access network gateway and configured to perform processing of L1, L2 and L3 protocols of a radio access interface layers.

In some implementations, the S1 interworking function block 230 includes an access adaptation module 232, an S1-AP interface 234 and a S1-U interface 236. The access adaptation module 232 includes access adaptation functions and mapping tables and facilitates communications with the access network via the access air interface block 220 (e.g., access gateway network). The access adaptation module 232 may also perform traffic management function for the data plane block 212. The S1-AP interface 234 is an interface for control messages between the S1 interworking function block 230 and the MME block 240 and communicates with the MME block 240 using S1-C interface over a link 235. The S1-U interface 236 is an interface with the SGW/PGW block 250 and communicates user plane data using the S1-U protocol over the link 255. The S1-U interface 236 and the SGW/PGW block 250 are capable of performing processes related to GPRS tunneling protocol (GTP), user datagram protocol (UDP) and/or IP protocols. The MME block 240 includes an NAS module 242 and a S1-AP module 244. The NAS module 242 performs NAS messaging with the NAS block 214. The S1-AP module 244 is responsible for communicating control messages with the S1-AP interface 234. Some of the functionalities of the MME block 240 were described above with respect to MME 112 of FIGS. 1A and 1B. The interworking areas addressed by the system 200A includes session management, bearer management, error and notification management and emergency calls handling as discussed above with respect to FIG. 1B, and will be further described below with respect to FIG. 2B and FIGS. 3A-3B.

FIG. 2B shows the functional block diagram 200B for the S1 interworking function block 230. In some implementations, the functional block diagram 200B includes an access authentication block 262, an access session management block 263, an access paging block 264, an access bearer management block 265, an access identities block 266, an access traffic management block 267, a mapping and coordination logic block 270, and EPS authentication block 272, an EPS session management block 273, an EPS paging block 274, and EPS bearer management block 275, an EPS identities block 276 and an EPS traffic management block 277.

In some implementations, the access authentication block 262 provides the access side authentication protocol and algorithms. The access session management block 263 is responsible for providing the connection management protocol and message handling for the access network. The access paging block 264 provides the logic and messaging for handling page messages to the UE 210 for mobile terminating calls. The access bearer management block 265 is responsible for providing the logic and messaging for handling bearer setup, teardown and modification on the access network. The access identities block 266 can provide storage and can check for access side radio identifiers. The access traffic management block 267 is responsible for performing the traffic management functions such as policing, shaping and queue management on the access network side.

In one or more implementations, the mapping and coordination logic block 270 can provide a set of algorithms for mapping various functions between the access and EPS networks. The mapping and coordination logic block 270 is also responsible for managing identities, bearers and traffic management queues between the two networks (e.g., access and EPS networks), so that the user connecting on the access network will receive seamless service on the EPS core network. In some implementations, the mapping and coordination logic block 270 provides message processing and message generation logic for both networks messaging, including the mapping between various information elements contained within the messages. The mapping and coordination logic block 270 is further responsible for providing mapping of quality of service classes between the two networks and services the service level agreements (SLAs) across the two networks.

In some implementations, the EPS authentication block 272 provides the EPS standard authentication protocol and algorithms. The EPS session management block 273 is responsible for providing the connection management protocol and message handling as defined in the EPS standards. The EPS paging block 274 can provide the logic and messaging for handling page messages from the EPS network. The EPS bearer management block 275 is to provide the logic and messaging for handling bearer setup, teardown and modification from the EPS network. The EPS Identities block 276 is responsible for providing storage and checking for EPS side radio identifiers. The EPS traffic management block 277 can provide the traffic management functions such as policing, shaping and queue management to match the EPS specifications.

FIG. 2C shows the functional block diagram 200C for the EPS interworking function block 218. In some implementations, the EPS interworking function block 218 includes an access identities block 282, an access session management block 284, an access bearer management block 286, a mapping coordination logic block 290, an EPS NAS identifiers block 292, an EPS NAS session management block 294 and an EPS NAS bearer management block 296.

In one or more implementations, the access identifiers block 282 is responsible for providing storage and processing for access side radio identifiers in the user equipment. The access session management block 284 can provide the connection management protocol and message handling towards the access network. The access bearer management block 286 provides the logic and messaging for handling bearer setup, teardown and modification towards the access network.

In some implementations, the mapping and coordination logic block 290 provides the set of algorithms for mapping various functions between the access and EPS networks. The mapping and coordination logic block 290 can also manage identities, bearers and traffic management queues between the two networks. In one or more implementations, the mapping and coordination logic block 290 is also responsible for providing message processing and message generation logic for access network messaging and EPS NAS messaging including the mapping between various information elements contained within the messages.

In some implementations, the EPS NAS identifiers block 292 provides storage and processing for EPS NAS identifiers as defined in EPS standards. The EPS NAS session management block 294 is responsible for providing the connection management protocol and message handling towards the EPS network as defined by the EPS NAS Protocol. The EPS NAS bearer management block 296 can provide the logic and messaging for handling bearer setup, teardown and modification as defined by the EPS NAS protocol.

Figure 3A:
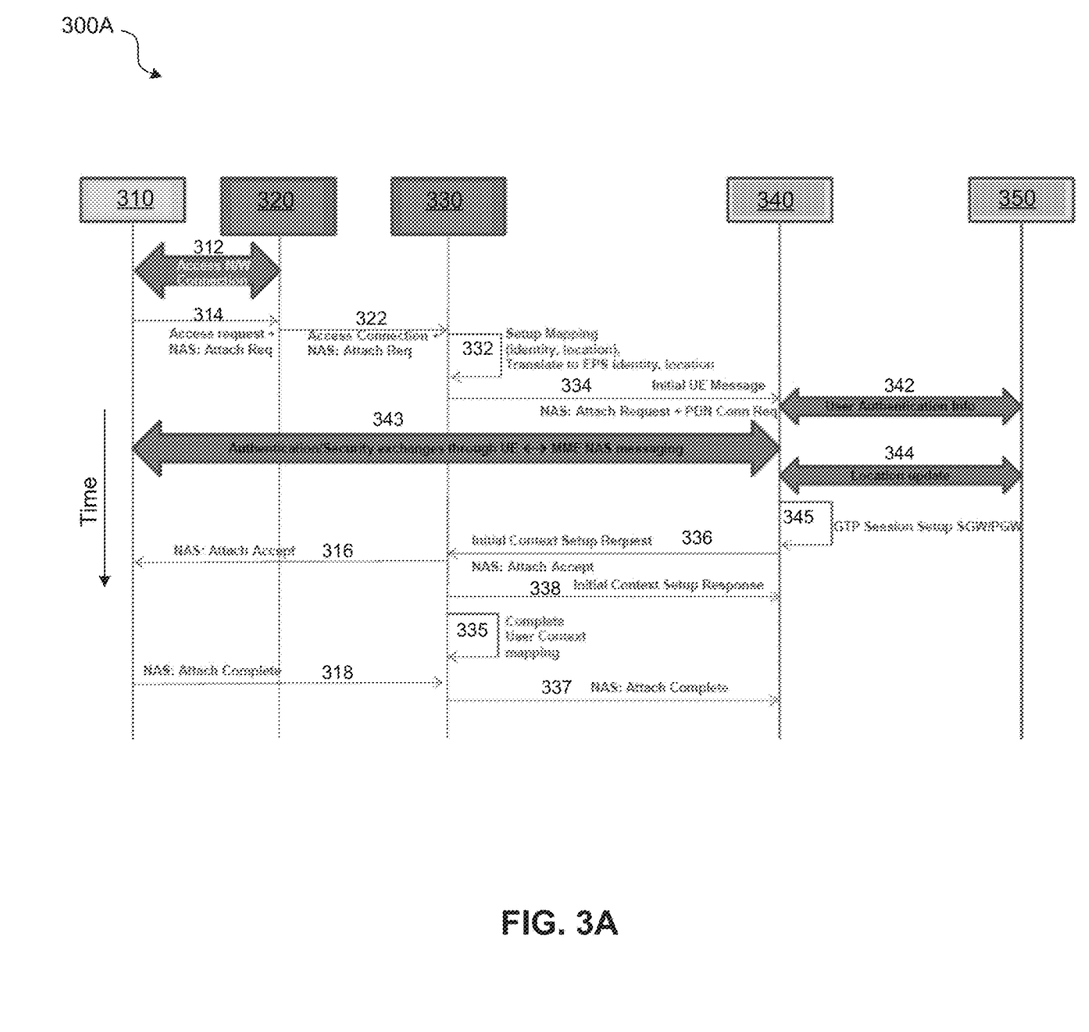
FIGS. 3A-3B are timing diagrams illustrating session management with S1 interworking function (IWF) and bearer management with S1 IWF, according to certain aspects of the disclosure.
Figure 3B:
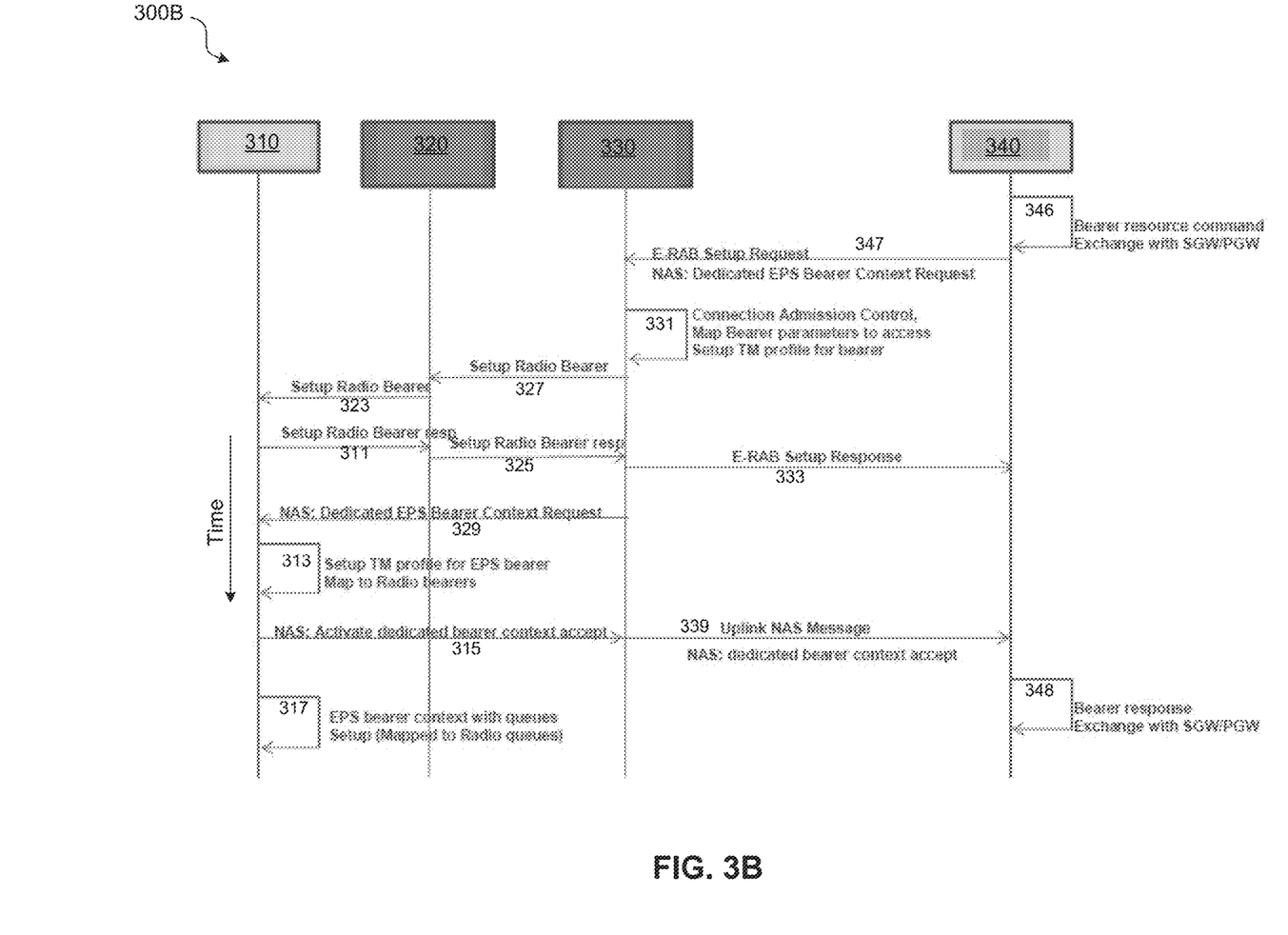

FIGS. 3A-3B are timing diagrams 300A and 300B illustrating session management with S1 interworking function (IWF) and bearer management with S1 IWF, according to certain aspects of the disclosure. The timing diagrams 300A shown in FIG. 3A illustrates session management with the S1 interworking function (IWF) that takes place through a number of interactions between some of a UE 310, an access gateway 320, an S1 IWF 330, an MME 340 and an HSS 350, at various instances of time. For example, the session management can start with an access network connection 312 between the UE 310 and the access gateway 320. The UE 310 may send an access request and NAS attach request 314 to the access gateway 320, which is forwarded (322) by the access gateway 320 to the S1 IWF 330. The S1 IWF 330, initiates a process 332, in which mapping setup of identity and location of the UE is translated into a corresponding EPS identify and location. The S1 IWF 330 then send an initial UE message including a NAS attach request and PDN connection request to the MME 340, after which user authentication information exchange 342 between the S1 IWF 330 and the HSS 350 takes place.

In a next step, authentication and/or security exchanges 343 are taken place between the UE 310 and the MME 340 through NAS messaging. Then, location update information exchange 344 is taken place between the MME 340 and HSS 350, after which the MME 340 performs a GTP session set up process 345 with the SGW/PGW 116 of FIG. 1B. Then, an initial context setup request 336 including a NAS attach accept message is sent form the MME 340 to the S1 IWF 330, which is communicated via a NAS accept message 316 to the UE 310. The S1 IWF 330 then sends an initial context setup response 338 to the MME 340 and in a process 335 completes user context mapping. Finally, the UE 310 sends an attach complete message 318 to the S1 IWF 330, which in turn sends a NAS attach complete message 337 to the MME 340.

The timing diagrams 300B shown in FIG. 3B illustrates bearer management with the S1 interworking function (IWF) that takes place through a number of interactions between some of the UE 310, the access gateway 320, the S1 IWF 330 and the MME 340, at various instances of time. The bearer management process can start with the MME 340 initiating a bearer resource command exchange 346 with the SGW/PGW 116 of FIG. 1B. Then, the MME 340 can send an E-RAB setup request 347 including NAS dedicated EPS bearer context request to the S1 IWF 330, which in turn initiates process 331 to perform connection admission control and mapping bearer parameters to access setup TM profile for the bearer. The S1 IWF 330 then sends a setup radio bearer request 327 to the access gateway 320, which in turn sends a setup radio bearer request 323 to the UE 310. In response, the UE 310 sends a setup radio bearer response 311 to the to the access gateway 320, which communicates a setup radio bearer response 325 to the S1 IWF 330. The S1 IWF 330 then prepares and sends an E-RAB setup response 333 to the MME 340 and then sends a NAS dedicated EPS bearer context request 329 to the UE 310. The UE 310 initiates a process 313 to setup TM profile for EPS bearer map to radio bearers and then sends a NAS activate dedicated bearer context accept message 315 to the S1 IWF 330. The S1 IWF 330 consequently sends an uplink NAS message 339 including the NAS dedicated bearer context accept message to the MME 340. The MME 340 then performs a bearer response exchange 348 with the SGW/PGW 116 of FIG. 1B. Finally, the UE 310 performs a process 317 for setting up EPS bearer context with queues including mapping to radio queues.

Figure 4:
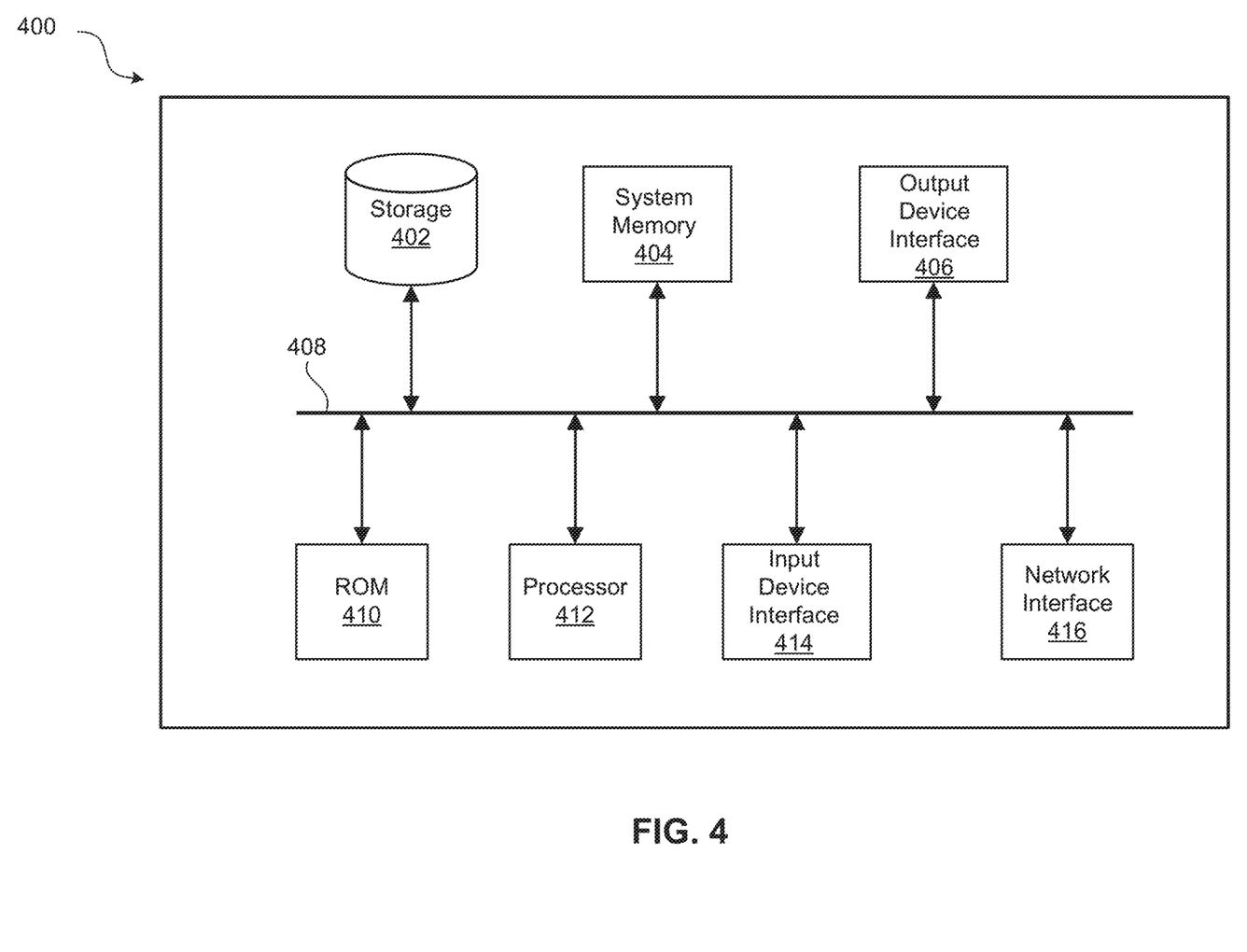
FIG. 4 is a block diagram conceptually illustrating an electronic system 400 with which aspects of the subject technology are implemented.

FIG. 4 is a block diagram conceptually illustrating an electronic system 400 with which aspects of the subject technology are implemented. Electronic system 400, for example, can be a desktop computer, a laptop computer, a tablet computer, a server, a switch, a router, a base station, a receiver, a phone, a personal digital assistant (PDA), or generally any electronic device that has processing power and memory and communication capability. Such an electronic system may include various types of computer readable media and interfaces for various other types of computer readable media. Electronic system 400 includes bus 408, processing unit(s) 412, system memory 404, read-only memory (ROM) 410, permanent storage device 402, input device interface 414, output device interface 406, and network interface 416, or subsets and variations thereof.

Bus 408 collectively represents all system, peripheral, and chipset buses that communicatively connect the numerous internal devices of electronic system 400. In one or more implementations, bus 408 communicatively connects processing unit(s) 412 with ROM 410, system memory 404, and permanent storage device 402. From these various memory units, processing unit(s) 412 retrieves instructions to execute and data to process in order to execute the processes of the subject disclosure. The processing unit(s) 412 can be a single processor or a multi-core processor in different implementations.

ROM 410 stores static data and instructions that are needed by processing unit(s) 412 and other modules of the electronic system. Permanent storage device 402, on the other hand, is a read-and-write memory device. This device is a non-volatile memory unit that stores instructions and data even when electronic system 400 is off. One or more implementations of the subject disclosure use a mass-storage device (such as a magnetic or optical disk and its corresponding disk drive) as permanent storage device 402.

Other implementations use a removable storage device (such as a floppy disk, flash drive, and its corresponding disk drive) as permanent storage device 402. Like permanent storage device 402, system memory 404 is a read-and-write memory device. However, unlike storage device 402, system memory 404 is a volatile read-and-write memory, such as random access memory. System memory 404 stores any of the instructions and data that processing unit(s) 412 needs at runtime. In one or more implementations, the processes of the subject disclosure are stored in system memory 404, permanent storage device 402, and/or ROM 410. From these various memory units, processing unit(s) 412 retrieves instructions to execute and data to process in order to execute the processes of one or more implementations.

Bus 408 also connects to input and output device interfaces 414 and 406. Input device interface 414 enables a user to communicate information and select commands to the electronic system. Input devices used with input device interface 414 include, for example, alphanumeric keyboards and pointing devices (also called "cursor control devices"). Output device interface 406 enables, for example, the display of images generated by electronic system 400. Output devices used with output device interface 406 include, for example, printers and display devices, such as a liquid crystal display (LCD), a light emitting diode (LED) display, an organic light emitting diode (OLED) display, a flexible display, a flat panel display, a solid state display, a projector, or any other device for outputting information. One or more implementations may include devices that function as both input and output devices, such as a touchscreen. In these implementations, feedback provided to the user can be any form of sensory feedback, such as visual feedback, auditory feedback, or tactile feedback; and input from the user can be received in any form, including acoustic, speech, or tactile input.

Finally, as shown in FIG. 4, bus 408 also couples electronic system 400 to a network (not shown) through network interface 416. In this manner, the computer can be a part of a network of computers (such as a local area network ("LAN"), a wide area network ("WAN"), or an Intranet, or a network of networks, such as the Internet. Any or all components of electronic system 400 can be used in conjunction with the subject disclosure.

Many of the above-described features and applications may be implemented as software processes that are specified as a set of instructions recorded on a computer readable storage medium (alternatively referred to as computer-readable media, machine-readable media, or machine-readable storage media). When these instructions are executed by one or more processing unit(s) (e.g., one or more processors, cores of processors, or other processing units), they cause the processing unit(s) to perform the actions indicated in the instructions. Examples of computer readable media include, but are not limited to, RAM, ROM, read-only compact discs (CD-ROM), recordable compact discs (CD-R), rewritable compact discs (CD-RW), read-only digital versatile discs (e.g., DVD-ROM, dual-layer DVD-ROM), a variety of recordable and/or rewritable DVDs (e.g., DVD-RAM, DVD-RW, DVD+RW, etc.), flash memory (e.g., SD cards, mini-SD cards, micro-SD cards, etc.), magnetic and/or solid state hard drives, ultra density optical discs, any other optical or magnetic media, and floppy disks. In one or more implementations, the computer readable media does not include carrier waves and electronic signals passing wirelessly or over wired connections, or any other ephemeral signals. For example, the computer readable media may be entirely restricted to tangible, physical objects that store information in a form that is readable by a computer. In one or more implementations, the computer readable media is non-transitory computer readable media, computer readable storage media, or non-transitory computer readable storage media.

In one or more implementations, a computer program product (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

While the above discussion primarily refers to microprocessor or multi-core processors that execute software, one or more implementations are performed by one or more integrated circuits, such as application specific integrated circuits (ASICs) or field programmable gate arrays (FPGAs). In one or more implementations, such integrated circuits execute instructions that are stored on the circuit itself.

Figure 5:
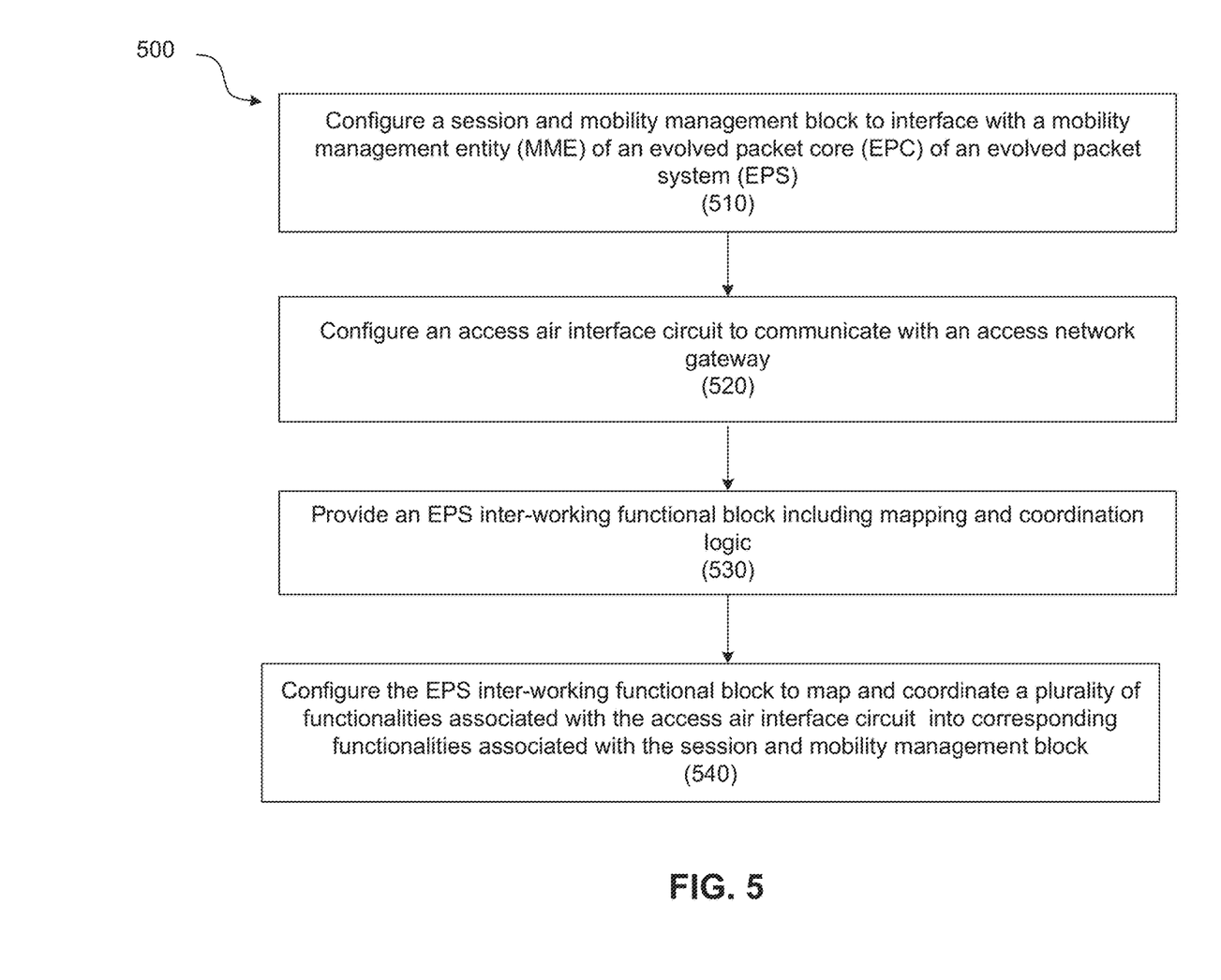
FIG. 5 is a flow diagram illustrating a method of deployment of EPS services over an LTE radio network and a non-LTE radio network, according to certain aspects of the disclosure

FIG. 5 is a flow diagram illustrating a method 500 of deployment of EPS services over an LTE radio network and a non-LTE radio network, according to certain aspects of the disclosure. The method 500 includes configuring a session and mobility management block (e.g., 218 of FIG. 2) to interface with a mobility management entity (MME) (e.g., 112 of FIG. 1 or 240 of FIG. 2) of an evolved packet core (EPC) (e.g., 110 of FIG. 1) of an evolved packet system (EPS) (510). The method 500 further includes configuring an access air interface circuit (e.g., 130 of FIG. 1) to communicate with an access network gateway (e.g., 106 of FIG. 1) (520). An EPS inter-working functional block (e.g., 230 of FIG. 2) including mapping and coordination logic is provided (530). The EPS inter-working functional block is configured to map and coordinate a plurality of functionalities associated with the access air interface circuit into corresponding functionalities associated with the session and mobility management block (540).

Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

It is understood that any specific order or hierarchy of blocks in the processes disclosed is an illustration of example approaches. Based upon design preferences, it is understood that the specific order or hierarchy of blocks in the processes may be rearranged, or that all illustrated blocks be performed. Any of the blocks may be performed simultaneously. In one or more implementations, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

As used in this specification and any claims of this application, the terms "base station", "receiver", "computer", "server", "processor", and "memory" all refer to electronic or other technological devices. These terms exclude people or groups of people. For the purposes of the specification, the terms "display" or "displaying" means displaying on an electronic device.

The description of the subject technology is provided to enable any person skilled in the art to practice the various aspects described herein. While the subject technology has been particularly described with reference to the various figures and aspects, it should be understood that these are for illustration purposes only and should not be taken as limiting the scope of the subject technology.

A reference to an element in the singular is not intended to mean "one and only one" unless specifically stated, but rather "one or more." The term "some" refers to one or more. Underlined and/or italicized headings and subheadings are used for convenience only, do not limit the subject technology, and are not referred to in connection with the interpretation of the description of the subject technology. All structural and functional equivalents to the elements of the various aspects described throughout this disclosure that are known or later come to be known to those of ordinary skill in the art are expressly incorporated herein by reference and intended to be encompassed by the subject technology. Moreover, nothing disclosed herein is intended to be dedicated to the public regardless of whether such disclosure is explicitly recited in the above description.

Although the invention has been described with reference to the disclosed aspects, one having ordinary skill in the art will readily appreciate that these aspects are only illustrative of the invention. It should be understood that various modifications can be made without departing from the spirit of the invention. The particular aspects disclosed above are illustrative only, as the present invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative aspects disclosed above may be altered, combined, or modified and all such variations are considered within the scope and spirit of the present invention. While compositions and methods are described in terms of "comprising," "containing," or "including" various components or steps, the compositions and methods can also "consist essentially of" or "consist of" the various components and operations. All numbers and ranges disclosed above can vary by some amount. Whenever a numerical range with a lower limit and an upper limit is disclosed, any number and any subrange falling within the broader range are specifically disclosed. Also, the terms in the claims have their plain, ordinary meaning unless otherwise explicitly and clearly defined by the patentee. If there is any conflict in the usages of a word or term in this specification and one or more patent or other documents that may be incorporated herein by reference, the definitions that are consistent with this specification should be adopted.

What is claimed is:

1. A non Long Term Evolution (non-LTE) user equipment (UE) comprising:
    a session and mobility management block for interfacing the non-LTE UE with a mobility management entity (MME) block of an evolved packet core (EPC) of an evolved packet system (EPS) to support long term evolution (LTE) EPS-based services in a satellite network;
    an access air interface circuit for communication with an access network gateway of a non-LTE access network, wherein the access network gateway is coupled to a satellite network; and
    an EPS inter-working functional block including mapping and coordination logic; wherein the non-LTE UE is configured to:
        send, by the EPS inter-working functional block of the non-LTE UE, a non-access stratum (NAS) message as an uplink NAS message to the MME block, wherein the NAS message triggers an S1 interworking function (S1 IWF) to map a non-LTE network identifier corresponding to the non-LTE UE to an EPS identifier corresponding to the non-LTE UE; and
        in response to receiving a NAS Accept message from the S1 IWF, sending, by the non-LTE UE to S1 IWF, a NAS Attach Complete message, wherein the NAS Attach Complete message causes a mapping of an EPS bearer to radio bearers of the non-LTE access network.

2. The UE of claim 1, wherein the session and mobility management block is configured to directly interface with the EPC using a non-access stratum (NAS) protocol.

3. The UE of claim 1, wherein the access network gateway comprises a non-long-term evolution (non-LTE) radio access network gateway.

4. The UE of claim 1, wherein the access network gateway comprises a satellite network gateway or a gateway of a terrestrial wireless network with limited frequency spectrum.

5. The UE of claim 1, wherein the EPS inter-working functional block is configured to map and coordinate a plurality of functionalities associated with the access air interface circuit including an access identification, an access session management, and an access bearer management.

6. The UE of claim 5, wherein the EPS inter-working functional block is configured to map the functionalities associated with the access identification, the access session management, and the access bearer management into EPS NAS identifiers, EPS NAS session management, and EPS NAS bearer management functionalities, respectively.

7. An access network gateway apparatus of a non Long Term Evolution (non-LTE) network, the access network gateway comprising:
    an access air interface circuit for communication with a non-LTE user equipment and functions as an access network gateway, wherein the access network gateway is coupled to a satellite network;
    an access adaptation block for mapping a plurality of functionalities associated with the access air interface circuit into corresponding functionalities associated with evolved packet system (EPS) services; and a control block for interfacing the access adaptation block with a mobility management entity (MME) of an evolved packet core (EPC) of the EPS services;

wherein the access network gateway apparatus is configured to:

receive, by the MME block from the non-LTE UE, a non-access stratum (NAS) message as an uplink NAS message, wherein the NAS message triggers an S1 interworking function (S1-IWF) to map a non-LTE network identifier corresponding to the non-LTE UE to an EPS identifier corresponding to the non-LTE UE;

forward, from the network access gateway to the non-LTE UE, a setup radio bearer request; and receive, from the non-LTE UE by the network access gateway, a setup radio bearer response, wherein the radio bearer response indicates a mapping of a non-LTE network identifier corresponding to the non-LTE UE to an EPS identifier corresponding to the non-LTE UE.

8. The apparatus of claim 7, wherein the access air interface circuit comprises a satellite network access air interface or an access air interface of a terrestrial wireless network with limited frequency spectrum.

9. The apparatus of claim 7, wherein the plurality of functionalities associated with the access air interface circuit include an access authentication, an access session management, an access paging, an access bearer management, an access identities, and an access traffic management.

10. The apparatus of claim 7, wherein the corresponding functionalities associated with the EPS include an EPS authentication, an EPS session management, an EPS paging, an EPS bearer management, an EPS identities, and an EPS traffic management.

11. The apparatus of claim 7, wherein the control block comprises an S1AP interface configured to transmit and receive S1-C control messages to and from the MME of the EPC.

12. The apparatus of claim 7, wherein the control block is configured to send S1-U user plane data to a signaling gateway (SGW) and a packet data network gateway (PGW).

13. The apparatus of claim 7, wherein the control block is configured to receive S1-U user plane data from a PGW and a PGW.

14. A method comprising:

configuring a session and mobility management block of a non-Long Term Evolution (non-LTE) user equipment (UE) to interface the non-LTE UE with a mobility management entity (MME) block of an evolved packet core (EPC) of an evolved packet system (EPS) to support long term evolution (LTE) EPS-based services in a satellite network;

configuring a LTE non-access stratum (NAS) block to setup EPS session using NAS message exchanges between the non-LTE UE and the MME block for transfer of NAS messages;

configuring an access air interface circuit of the non-LTE UE to communicate with an access network gateway of a non-LTE access network, wherein the access network gateway is coupled to the satellite network; and providing an EPS inter-working functional block including mapping and coordination logic within the UE; and configuring the EPS inter-working functional block of the non-LTE UE to map and coordinate a plurality of functionalities associated with the access air interface circuit into corresponding functionalities associated with the session and mobility management block by causing the non-LTE UE to:

send a non-access stratum (NAS) message as an uplink NAS message to the MME block, wherein the NAS message triggers an S1 interworking function (S1 IWF) to map a non-LTE network identifier corresponding to the non-LTE UE to an EPS identifier corresponding to the non-LTE UE; and in response to receiving a NAS Accept message from the MME block, send a NAS attach complete message, wherein the NAS attach complete message causes a mapping of an EPS bearer to radio bearers of the non-LTE access network.

15. The method of claim 14, further comprising configuring the session and mobility management block to directly interface with the EPC using a non-access stratum (NAS) protocol.

16. The method of claim 14, further comprising configuring the EPS inter-working functional block to map and coordinate an access identification, an access session management, and an access bearer management.

17. The method of claim 16, further comprising configuring the EPS inter-working functional block to map the functionalities associated with the access identifiers, the access session management, and the access bearer management into EPS NAS identifiers, EPS NAS session management, and EPS NAS bearer management functionalities, respectively.

18. The method of claim 14, wherein the access network gateway comprises an LTE radio access network gateway.

* * * * *